United States Patent [19]

Washizuka et al.

[11] Patent Number: 5,030,315
[45] Date of Patent: Jul. 9, 1991

[54] METHODS OF MANUFACTURING COMPOUND SEMICONDUCTOR CRYSTALS AND APPARATUS FOR THE SAME

[75] Inventors: Syoichi Washizuka, Yokohama; Kazutaka Terashima, Ebina; Johji Nishio; Masayuki Watanabe, both of Yokohama, all of Japan

[73] Assignee: Kabushiki Kaisha Toshiba, Kawasaki, Japan

[21] Appl. No.: 908,985

[22] Filed: Sep. 18, 1986

[30] Foreign Application Priority Data

Sep. 19, 1985 [JP] Japan .................... 60-205319

[51] Int. Cl.$^5$ ............................................. C30B 15/02
[52] U.S. Cl. ............................ 156/607; 156/620.2; 156/DIG. 70; 156/601
[58] Field of Search ............ 156/601, 605, 607, 608, 156/617 SP, DIG. 70, 620.2

[56] References Cited

U.S. PATENT DOCUMENTS

| | | | |
|---|---|---|---|
| 2,892,739 | 6/1959 | Rusler | 156/605 |
| 2,898,249 | 8/1959 | Jensen | 156/617 SP |
| 3,198,606 | 8/1965 | Lyons | 156/617 SP |
| 4,028,058 | 6/1977 | Beinert et al. | 156/617 SP |
| 4,528,061 | 7/1985 | Miyazawa et al. | 156/607 |
| 4,594,173 | 6/1986 | Hobgood et al. | 156/617 SP |
| 4,618,396 | 10/1986 | Shimoda et al. | 156/617 SP |

FOREIGN PATENT DOCUMENTS

| | | | |
|---|---|---|---|
| 0149898 | 7/1985 | European Pat. Off. | 156/605 |
| 0179095 | 11/1982 | Japan | 156/617 SP |

OTHER PUBLICATIONS

Steinemann et al., "Growth Peculiarities of Gallium Arsenide Single Crystals", Sol. State Electronics, vol. 6, pp. 597–604, 1963.

*Primary Examiner*—H. M. S. Sneed
*Assistant Examiner*—R. Bruce Breneman
*Attorney, Agent, or Firm*—Foley & Lardner

[57] ABSTRACT

A method of manufacturing compound semiconductor crystals, comprising the steps of, providing a compound semiconductor melt in a crucible, said melt having a composition ratio which deviates from stoichiometry, pulling a compound semiconductor crystal from said crucible by using a seed crystal, and during the pulling step, adding to the melt a constitutional element of said compound semiconductor melt which is present in less than a stoichiometric amount, the element being added in a quantity sufficient to maintain said composition ratio of the first step. An apparatus for manufacturing compound semiconductor crystals is also provided.

12 Claims, 6 Drawing Sheets

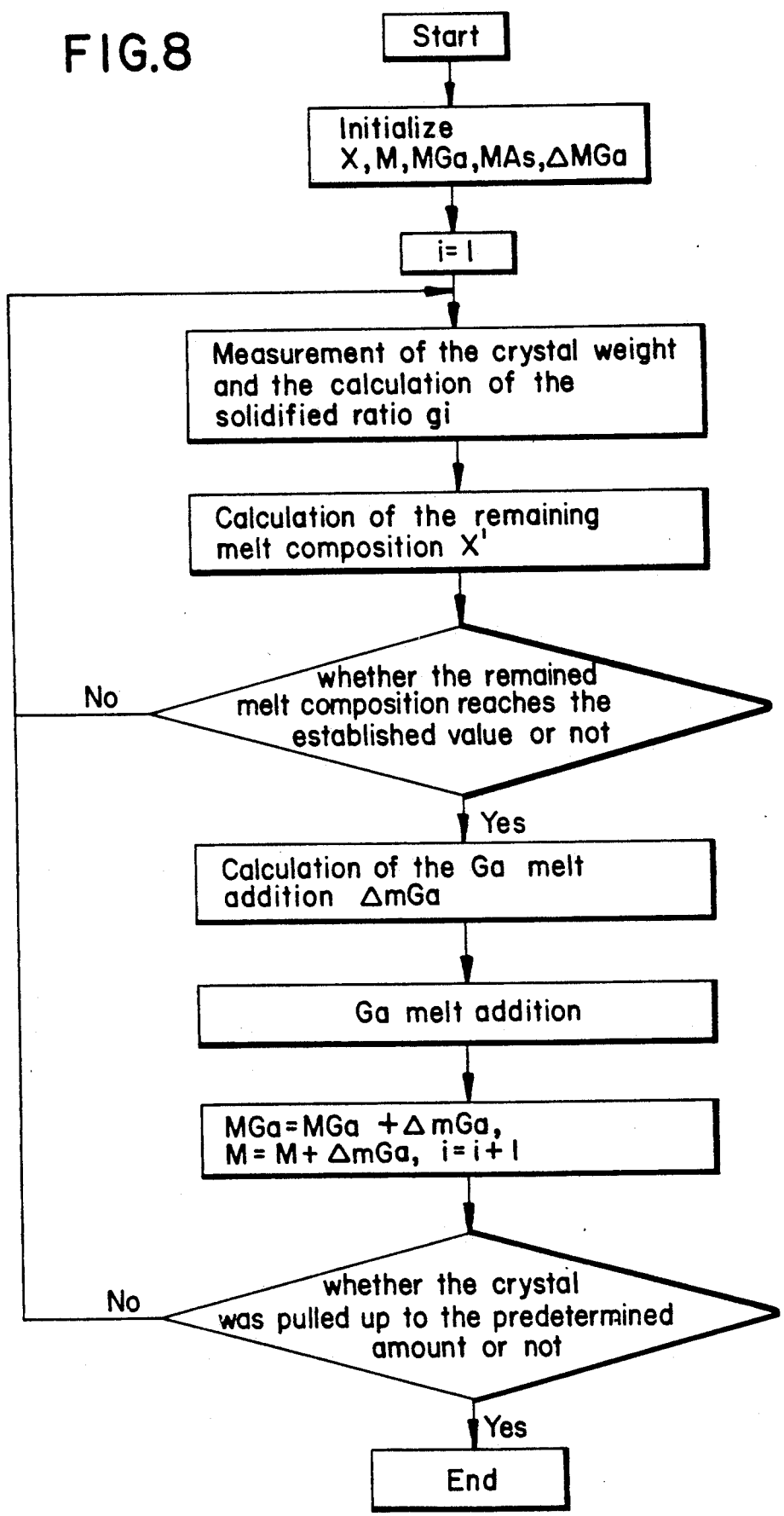

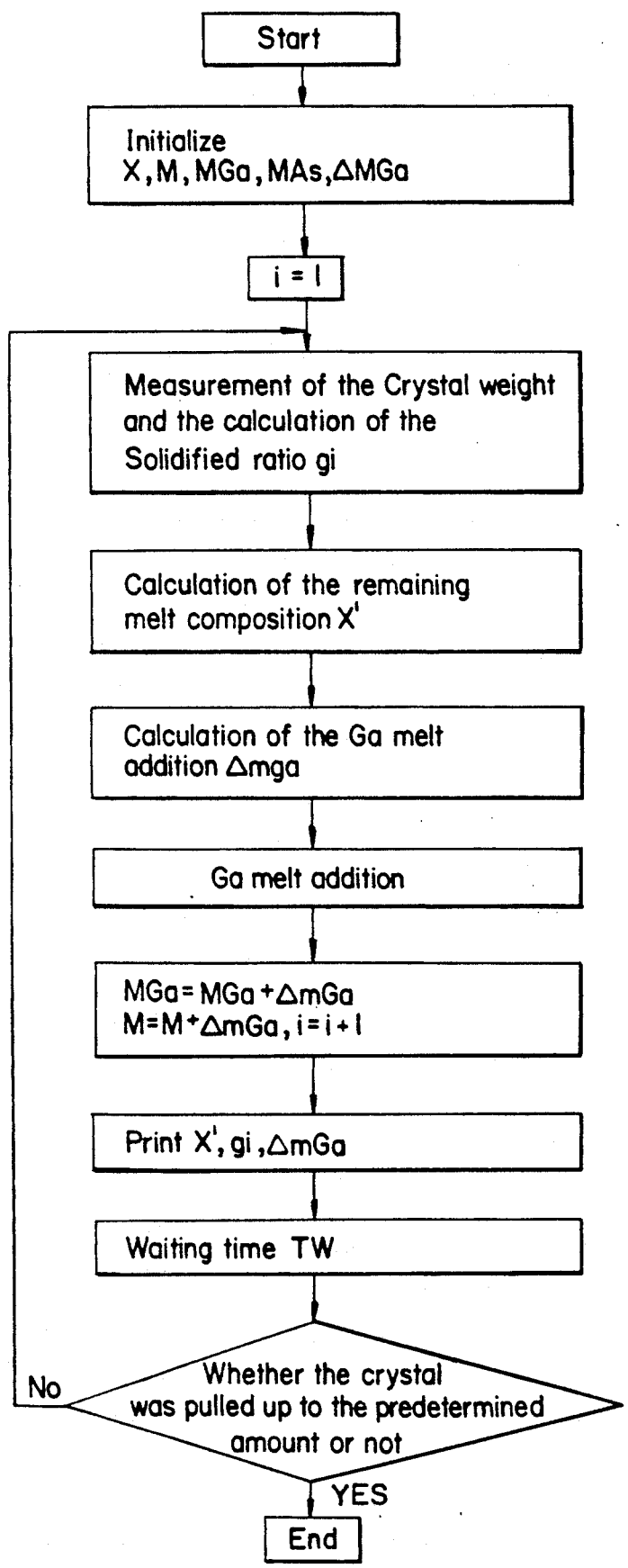

METHODS OF MANUFACTURING COMPOUND SEMICONDUCTOR CRYSTALS AND APPARATUS FOR THE SAME

BACKGROUND OF THE INVENTION

This invention relates to a manufacturing method of compound semiconductor crystals and to an apparatus for carrying out this method.

Recently, because of their large mobility at room temperature compared with Si single crystals, GaAs single crystals have come into widespread use as the substrate for super high speed ICs. For use as the IC substrate, there is desired a crystal that is semi-insulative and exhibits uniformity of electric properties. Especially, the undoped semi-insulative GaAs single crystal which has higher purity and shows high mobility and which is made by the direct compound LEC (liquid-encapsulated Czochralski) method using a PBN (pyrolitic boron nitride) crucible is undergoing a vigorous development.

Concerning this undoped crystal, however, the quality of being semi-insulative is sensitive to the composition. For instance, the relationships between the properties of the crystal and the composition ratio are well known (R. N. Thomas et al, "Semiconductors and Semimetals" Vol. 20, chapter 1.1, Academic Press, New York (1984)).

FIG. 1 shows the relationship between the melt composition and resistivity as well as mobility of GaAs. From this figure, it is understood that the resistivity and mobility are low in the Ga-rich compositions. In another example, the relationship between the solidified ratio of the GaAs melt and the resistivity is shown in FIG. 2 for several melt compositions. FIG. 2 shows that a crystal made from a melt in which the Ga/As mole ratio is greater than 1 does not become semi-insulative for the whole ingot. Furthermore, as shown in the following, a crystal made from a Ga-rich composition is poor in thermal stability, so that its use for semiconductor devices such as MESFET or integrated devices is not preferable. Concerning this point, FIG. 3 shows the relationship between the GaAs melt composition and the resistivity for various annealing conditions after growth. The thermal stability decreases as the Ga/As melt composition ratio exceeds 1.

As described in the previous examples, the melt composition is extremely important for the growth. Therefore, pulling of a GaAs single crystal is usually performed by setting the initial melt composition at a slightly As-rich (Ga/As mole ratio $\leq 1$) condition.

However, uniformity of electrical properties along the pull up axis is not sufficient, and the unevenness of the electric properties in the resulting wafer plane increases as the solidifying proceeds. Furthermore, polycrystallization is observed to a large degree. These effects occur because the As ratio in the As-rich GaAs melt increases as the solidifying proceeds.

On the other hand, an attempt has been made by introducing As vapor into a Ga-rich melt to control the GaAs melt composition (32th Spring Conference, p. 724, 1985, Japan Applied Physics Society). In this attempt, the tip opening of an ampoule containing As lumps is inserted upside down into the surface region of a GaAs melt, and then the ampoule is heated with a heater during the pulling process. This experimental result showed that the crystal is grown in the form of a Ga-rich to As-rich crystal along the GaAs ingot. Furthermore, it is difficult to detect the GaAs melt composition and the amount of introduced As during the pulling step because of the use of the As vapor, and it is thereby also difficult to control the composition of GaAs melt.

SUMMARY OF THE INVENTION

Accordingly, an object of the invention is to provide an improved method of manufacturing compound semiconductor crystals by the pulling method.

Another object of the invention is to provide a method for obtaining compound semiconductor crystals having improved uniformity of electrical properties along the direction of the pull up axis using a melt which deviates from stoichiometry.

Another object of the invention is to provide a method for obtaining compound semiconductor crystals that makes it possible to prevent polycrystallization using a melt composition which deviates from stoichiometry.

Another object of the invention is to provide a method for obtaining compound semiconductor crystals having only a small degree of non-uniformity for the electrical properties in any sectional plane of the ingot that is formed by a melt which deviates from stoichiometry.

Another object of the invention is to provide a method for obtaining compound semiconductor crystals with a good reliability for the manufacturing process.

Still another object of the invention is to provide an improved apparatus for obtaining compound semiconductor crystals.

In accomplishing the foregoing objects, there has been provided according to one aspect of this invention a method of manufacturing compound semiconductor crystals, comprising the steps of:

a) providing a compound semiconductor melt in a crucible, said melt having a composition ratio which deviates from stoichiometry;

b) pulling a compound semiconductor crystal from said crucible by using a seed crystal; and c) during said pulling step, adding to the melt a constituent element of said compound semiconductor melt which is present in less than a stoichiometric amount, said element being added in a quantity sufficient to maintain said composition ratio in step a).

According to another aspect of this invention there has also been provided an improved apparatus for manufacturing compound semiconductor crystals, comprising:

a first crucible for containing a compound semiconductor melt having a predetermined composition ratio which deviates from stoichiometry;

pull up means for pulling up a compound semiconductor crystal from said crucible by using a seed crystal;

melt supply means for adding to the melt a constituent element of said compound semiconductor melt which is present in less than a stoichiometric amount; and control means for controlling the quantity of said element to be added to maintain said predetermined composition ratio of said compound semiconductor melt.

BRIEF DESCRIPTION OF THE DRAWINGS

This invention, together with its various features and advantages, will be readily understood from the following more detailed description presented in conjunction with the following drawings, in which:

FIG. 8 is a flow chart to which this invention is applied; and

FIG. 9 is a flow chart showing another embodiment of this invention.

DETAILED DESCRIPTION OF THE PREFERRED EMBODIMENTS

Prior to the description of the method applied to the actual manufacture of the compound semiconductor crystal, certain experimental results will be considered as follows.

The inventors have investigated in detail, by the coulometry method, the correlation between the GaAs crystal composition that governs the electrical properties and the initial melt composition.

Figure 1:
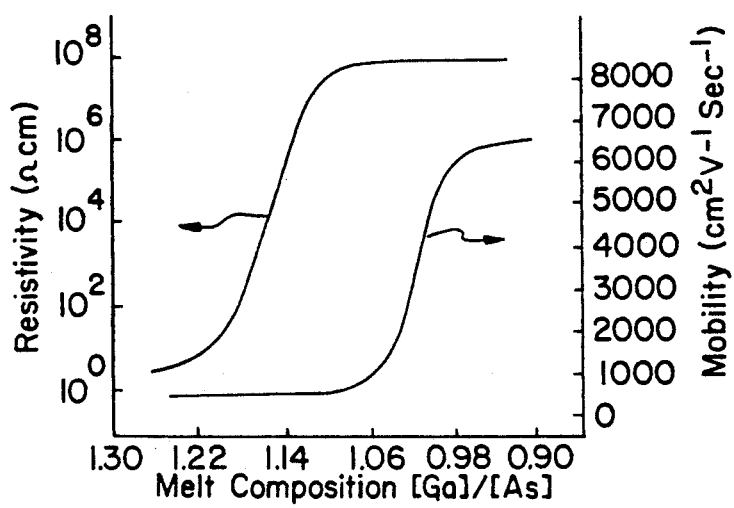
FIG. 1 is a diagram showing the relationship of the melt composition to resistivity and mobility of GaAs.
Figure 2:
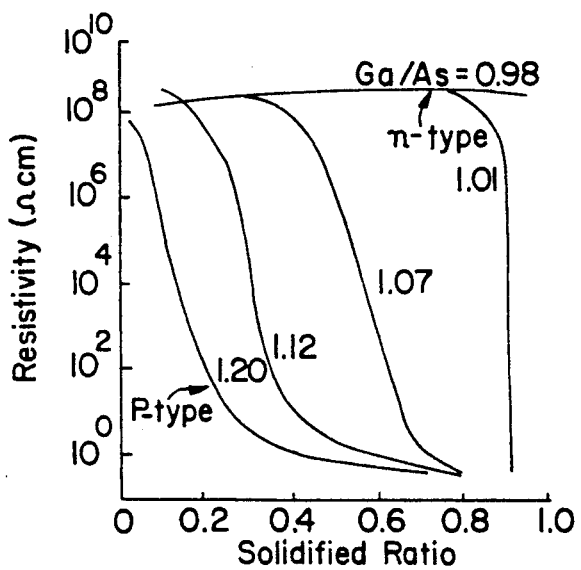
FIG. 2 is a diagram showing the relationship between the solidified ratio of GaAs melt and the resistivity.
Figure 3:
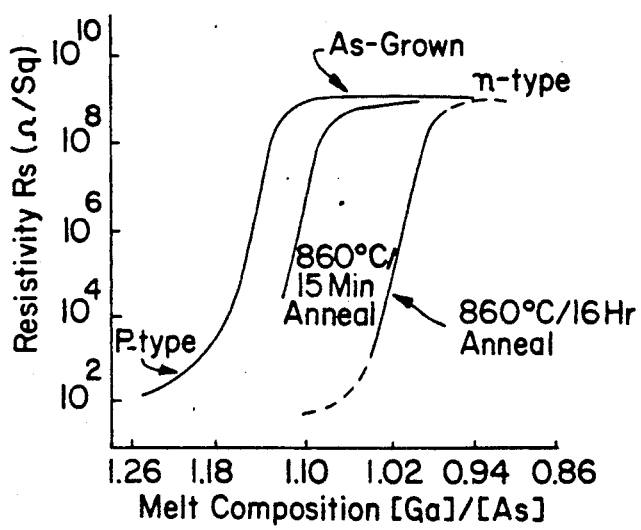
FIG. 3 is a diagram showing the relationship between the GaAs melt composition and the resistivity for the various annealing conditions after growth.
Figure 4:
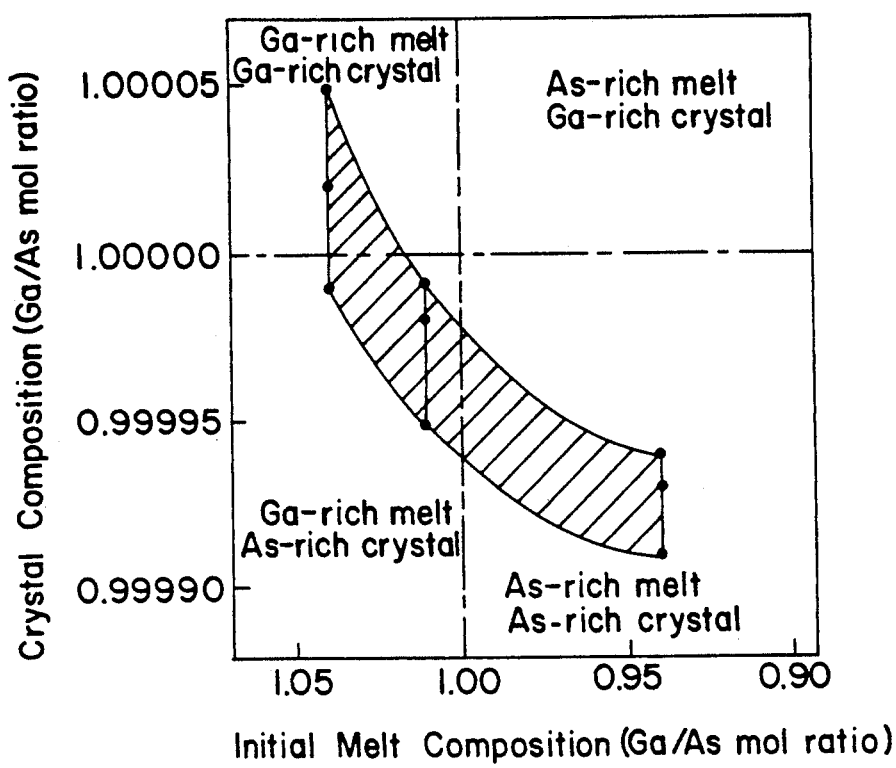
FIG. 4 is a diagram showing the quantity of scatter of the crystal composition of the obtained GaAs ingot along the pull up axis in relation to the GaAs melt composition, as obtained by the inventors in connection with this invention.

FIG. 4 illustrates the quantity of scatter of the crystal composition along the pull up axis of the obtained GaAs ingot in relation to the GaAs melt composition. In the Ga-rich melt region, the change of the crystal composition is steep and the width of the scatter of the crystal composition is relatively wide compared with the As-rich melt region. This means that the GaAs crystals obtained by the As-rich melt have relatively small scatter of the crystal composition as a function of the melt composition.

Figure 5:
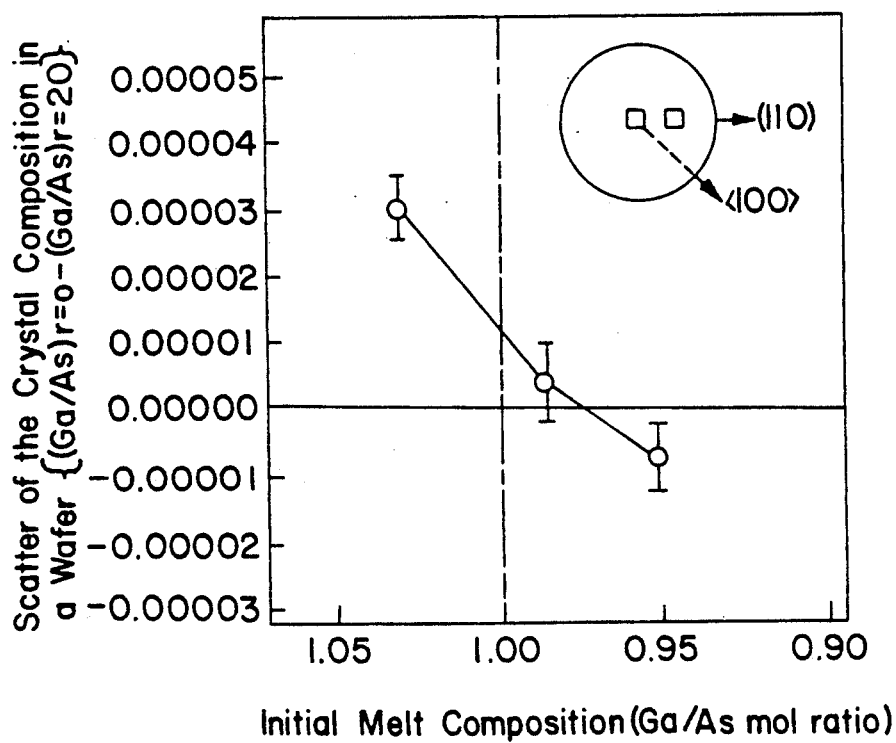
FIG. 5 is a diagram showing the deviation of the crystal composition between the center (r=o) and r=20 mm in the GaAs wafer obtained from the head of the ingot for several melt compositions.

FIG. 5 illustrates the deviation of the crystal composition between the center (r=o) and r=20 mm in the GaAs wafer obtained from the head of the ingot for several melt compositions. As a result, it became clear that the scatter of the crystal composition in the GaAs wafer is minimum at a melt composition of about 0.97 (Ga/As mole ratio).

From these figures, thereby, it is desirable to manufacture the GaAs crystal from this melt composition. However, because the initial melt composition deviates from stoichiometry (Ga/As mole ratio=1), the remaining melt composition shifts further to the As-rich side as the pulling procedure proceeds. Thus, crystals having uniformity of composition for a whole crystal cannot be obtained, so the uniformity of the electrical properties also cannot be obtained. Therefore, if the melt composition during the pulling could be maintained at a constant ratio, crystals having uniformity of composition would be obtained so that it would be possible to make the electrical properties uniform from head to tail. This can be accomplished by supplying Ga, which is the element present in less than the stiochiometric amount.

Figure 6:
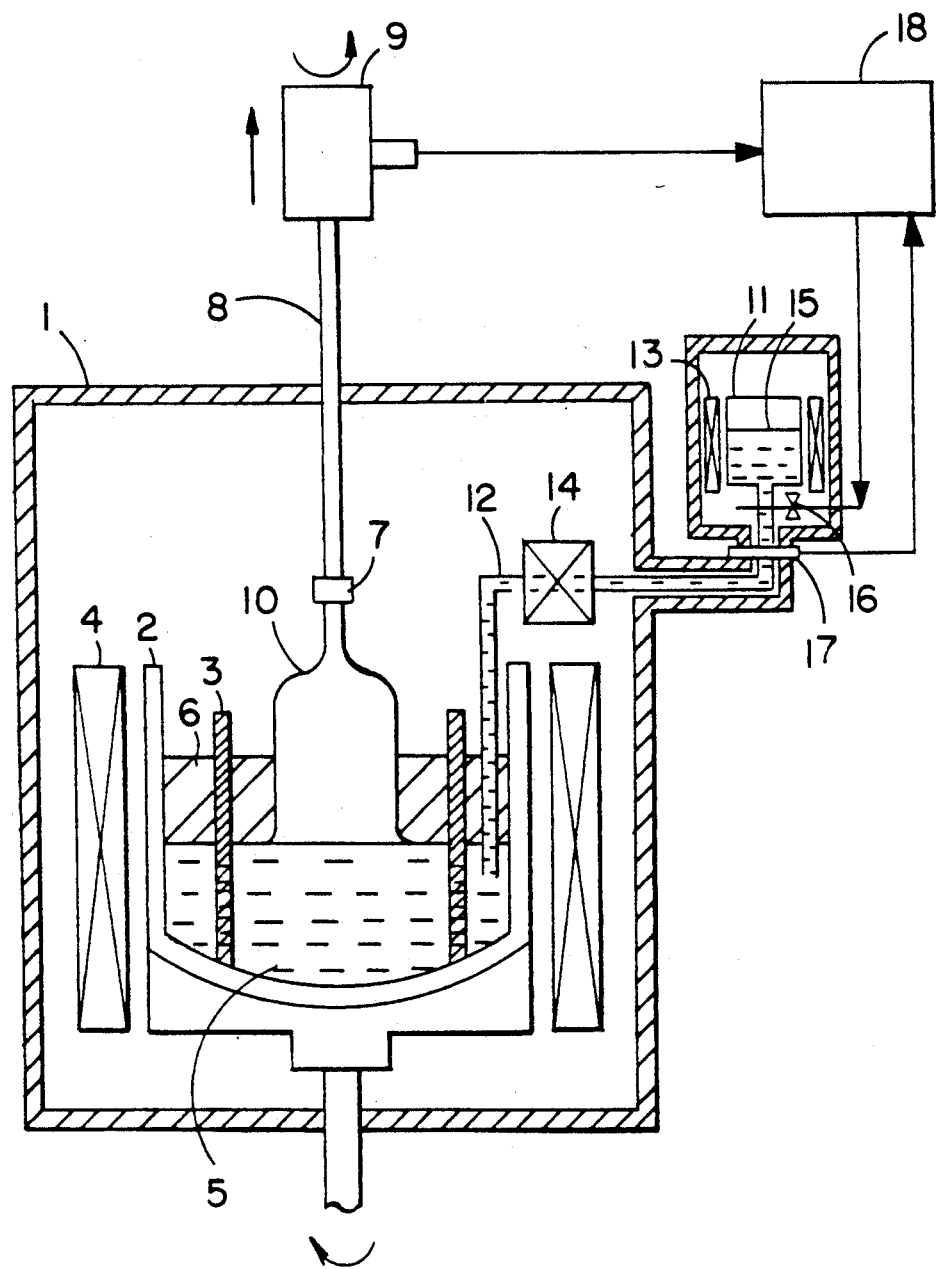
FIG. 6 is a diagram showing a cross sectional view of a single crystal manufacture apparatus to which this invention is applied.

FIG. 6 is a diagram showing a cross sectional view of a single crystal manufacturing apparatus to which this invention is applied.

In a high pressure chamber 1, there is a crucible 2 made of PBN, and this crucible 2 is enabled to rotate around a crucible shaft. An inner crucible 3 made of PBN is attached to the bottom of the crucible 2, and this inner crucible 3 has a number of openings around the wall. Outside of the crucible 2, a heater 4 is set to surround the crucible. GaAs melt 5 and $B_2O_3$ melt 6, which is a capsule layer, fill the crucible 2. A seed crystal 7 of GaAs is attached to the tip of a pull up shaft 8. To the pull up shaft 8, a weight measurement meter 9 is attached. This weight measurement meter 9 detects the weight of a GaAs crystal 10 being pulled up from the crucible 2.

This apparatus has a melt supply means including a Ga storage crucible 11 connected to a Ga supply tube 12. The Ga storage crucible 11 is heated with heater 13 (for 40°–50° C. heating), and the Ga supply tube 12 is also heated with a heater 14 for high temperature heating. Reference numeral 15 denotes the Ga melt. The Ga supply tube 12 has a double wall structure for maintaining the warmth of the Ga.

For the Ga supply tube 12, a valve 16 using a variable orifice is attached. A flow meter 17 using an electromagnetic flow meter is also attached to the Ga supply tube 12. The quantity of Ga melt to be added in each time interval is calculated with a control means (computer) 18. The control means 18 calculates the solidified ratio of the GaAs melt 5 depending on the weight signal from the weight measurement meter 9, and then calculates the quantity of Ga melt needed for compensating the composition shift of the GaAs melt 5. Then, the control circuit 18 opens the valve 16 for adding the Ga melt to the GaAs melt 5. The quantity of Ga flow is monitored with the flow meter 17. The control means 18 follows the quantity of Ga flow, and when the amount of added Ga reaches the set value the control means 18 closes the valve 16.

By repeating this cycle, the entire pull up can be done using the same GaAs melt composition as the initial one.

Concretely, the analysis for the remained melt composition, and the quantity of Ga to be supplied will be described in the following.

The crystal formed is characterized by a nearly stoichiometric ratio as shown in FIG. 4, and thus the remaining melt composition of Ga/As at the solidified ratio g can be expressed by means of the following equation:

$$Ga/As = \frac{MGa - \frac{ZGa}{ZGa + ZAs} \cdot g \cdot M}{MAs - \frac{ZAs}{ZGa + ZAs} \cdot g \cdot M} \cdot \frac{ZAs}{ZGa} \quad (1)$$

wherein, $$MGa = \frac{ZGa \cdot X}{ZAs + ZGa \cdot X} M, \text{ and } MAs = \frac{ZAs}{ZAs + ZGa \cdot X} M$$

X is the initial melt composition (Ga/As mole ratio), M- is the weight of the initial GaAs melt (g), MGa is the weight of Ga in the initial GaAs melt (g), MAs is the weight of As in the initial GaAs melt (g), ZGa is the atomic weight of Ga (69.72), and ZAs is the atomic weight of As (74.92).

The total weight of Ga (ΔMGa) to be added until g=1 in order to always equalize the remaining melt composition to the initial melt composition, satisfies the following equation:

$$\frac{MGa + \Delta MGa}{MAs} \times \frac{ZAs}{ZGa} = 1 \quad (2)$$

Substituting the next equation for (2), $$MGa = MAs \frac{ZGa}{ZAs} \cdot X$$

therefore, $$\Delta MGa = \frac{ZGa}{ZAs} MAs(1 - X) \quad (2')$$

In the case of X=0.97, M=1, the solution of the equation (240) becomes 0.0147, namely the total weight of Ga ΔMGa is about 1.5 percent of the initial GaAs melt.

The weight of Ga ΔmGa to be added for the solidified ratio changes Δg is expressed as follows:

$$\Delta mGa = \Delta MGa \cdot \Delta g \quad (3)$$

Figure 7:
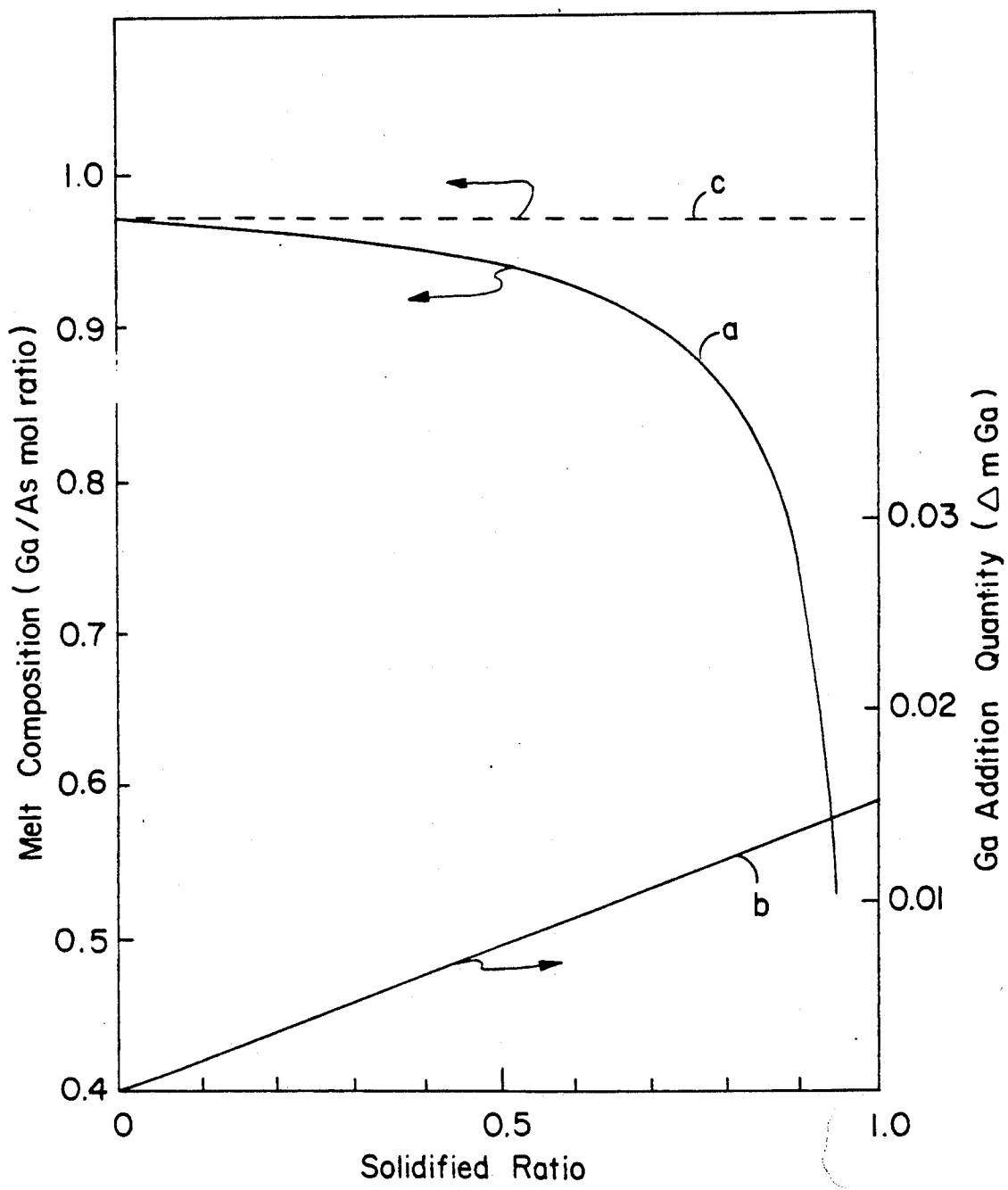
FIG. 7 is a diagram showing the relationship between the solidified ratio, the melt composition and the quantity of Ga addition.

These relationships are shown in FIG. 7. The relationship between the solidified ratio and the remaining melt composition calculated by the equation (1) for the initial melt composition X=0.97 is illustrated as the curve (a). The quantity of Ga needed for maintaining the remaining melt composition to the value 0.97 is expressed as the line (b) by solving equation (3) so that the remaining melt composition is able to be maintained as shown as the line (c).

FIG. 8 illustrates the flow chart for achieving the series of control actions to be performed with the control means 18. The steps are as follows:

[Step 1]; "Start"

[Step 2]; "Initialize"

In this step, the set up for each parameter is performed: X=initial melt composition (Ga/As mole ratio), M=the weight of initial GaAs melt (g), MGa=the weight of Ga in the initial GaAs melt (g), MAs=the weight of As in the initial GaAs melt (g) and ΔMGa=the total supply weight of Ga (g). The ΔMGa is calculated using the formula (2') described above.

[Step 3]; "i=1"

[Step 4]; "Measurement of the crystal weight, and the calculation of the solidified ratio $g_i$"

The weight of crystal pulling is measured with the weight measurement meter 9.

So, the solidified ratio gi is solved by the equation:

$$g_i = \frac{W}{M} \quad (4)$$

wherein, the weight is the real weight corrected against the buoyancy and so forth.

[Step 5]; "Calculation of the remaining melt composition"

$$X' = \frac{MGa - \frac{ZGa}{ZGa + ZAs} \cdot g_i \cdot M}{MAs - \frac{ZAs}{ZGa + ZAs} \cdot g_i \cdot M} \cdot \frac{ZAs}{ZGa} \quad (1')$$

Step 6]; "Determine whether the remaining melt composition reaches the established value or not"

For instance, the variation value is set at 0.05 so that the judgment equation is expressed as follows:

$$X - X' \geq 0.05 \quad (5)$$

When the condition does not satisfy this equation (5), the step goes back to [Step 4].

The variation value is preferably set within 0.1

Step 7]; "Calculation of the Ga melt addition mGa"

$$\Delta mGa = \Delta MGa \cdot \Delta g_i \quad (3)$$

wherein $$\Delta g_i = g_i - g_{i-1}$$

[Step 8]; "Ga melt addition"

[Step 9]; "MGa=MGa+ΔmGa,

M=M+ΔmGa, i=i+1"

[Step 10]; "Determine whether, the crystal was pulled up to the predetermined amount or not"

When the crystal was not pulled up for the predetermined amount, the step goes back to [Step 4].

[Step 11]; "End"

Table 1 shows an example in the case that X, X—X' in step 6 and M are set at 0.97, 0.05 and 1 kg, respectively.

TABLE 1

| | $g_i$ | $g_i$ | $X^1$ | mGA (g) |
|---|---|---|---|---|
| i = 1 | 0.147 | 0.147 | 0.965 | 2.2 |
| i = 2 | 0.275 | 0.128 | 0.965 | 1.9 |

As shown in this table, the interval of Ga addition becomes shorter corresponding to the progress of solidifying the GaAs melt.

Actual results of manufacturing GaAs single crystals will be described as follows.

Into the crucible 2 having an inner diameter of 150 mmφ and made of PBN, 3 kg of Ga and As raw materials and 600 g of $B_2O_3$ were introduced. The mole ratio of Ga/As of the raw material was set at 0.95. This crucible was then put into the chamber 1, and GaAs melt 5 of the Ga/As melt composition of 0.97 was obtained by the direct compound method. Namely, the raw materials were melted at about 1300° C. with the heater 4 under the high pressure condition (about 70 atmospheres) of Ar. The diffusion of As after the direct compounding is negligible. 100 g of Ga was introduced into the Ga storage crucible 11 and then was melted with the heater 13.

Next, the pull up from the crucible started rotating the seed crystal 7. The conditions were set at 20 atmospheres pressure of Ar. As for the seed crystal, a <100> GaAs crystal was used. The weight of the pulled up GaAs crystal is measured with the weight measurement meter 9, and the data is input to the control means 18. In the control means 18, the initial data and the control program shown in FIG. 8 had been loaded in advance.

In this embodiment, after shoulder formation, the GaAs crystal was grown at 80 mmφ up to the solidified ratio of about 0.85.

Though the GaAs crystal obtained was cut to wafers and investigated with respect to the crystal composition at the head, center and tail of the ingot, the composition ratio was confirmed as having a value of about 0.99994 for these samples and the scatter of them was within ±0.00001. Thus, a crystal having a very uniform composition was obtained. The resistivity was also checked and found to be about $5 \times 10^7$ cm uniformly from the head to tail of the ingot.

Furthermore, MESFETs were manufactured to the wafers by forming active layers by ion implantation of silicon at an acceleration voltage of 150 Kev and at a dose of $2.5 \times 10^{12}$ cm$^{-3}$. The threshold voltage $V_{th}$ was about $-3.5V$, and the scatter $\sigma V_{th}$ was below 50 mV. The scatter $\sigma V_{th}$ in each wafer was very small.

FIG. 9 shows another embodiment of the flow chart. In this embodiment, the step of "Waiting time" is set instead of [step 6] in FIG. 8. The data of the solidified ratio $g_i$, the remaining melt composition $X'$ and the quantity of Ga addition $\Delta mGa$ are printed out for confirming. Also in this embodiment, the remaining melt composition can be maintained by performing the waiting time $T_w$ for a sufficiently short period. The value $T_w$ may be set shorter as the solidified ratio proceeds.

As described above, according to these embodiments, GaAs crystals having improved uniformity of electrical properties along the direction of pull up axis were obtained. From the head to the tail, a single GaAs crystal ingot was obtained. Furthermore, in any wafer obtained, uniform electrical properties were obtained from head to tail. In contrast to this, for the wafers obtained by prior processes, the electrical properties in the wafer scatter enormously as the solidified rate proceeds.

And the embodiments described above, a good reliability for the manufacturing process was obtained.

This invention is not restricted to these embodiments. For instance, weight measurement means, melt supply means and control means 9, 11-18 are not restricted to the disclosed embodiments, but rather, equivalent means can be substituted. The flow chart and the formulas described may be replaced by others if desired. In addition to GaAs single crystals, compound semiconductors of Group III-V elements such as InP, InAs, GaSb may be applied by pulling from a Group V element-rich melt.

It is preferable to set the initial melt composition, namely, the mole ratio of the Group III element to the Group V element, above about 0.95:1, especially between about 0.96:1 and about 0.98:1. And it is preferable to maintain the melt composition between about 0.96:1 and about 0.98:1 during the pulling process.

What is claimed is:

1. A method of manufacturing compound semiconductor crystals, comprising the steps of:
    (a) providing a compound semiconductor melt consisting of Ga and As covered with a capsule layer in a crucible, said melt having a composition ratio in which Ga is present in less than a stoichiometric amount compared to As, and the mole ratio of Ga to As in said melt being above 0.95:1;
    (b) pulling an undoped GaAs compound semiconductor crystal from said crucible by using a seed crystal; and
    (c) during said pulling step, adding only Ga to the melt, said Ga being added as a melt and in a quantity sufficient to maintain said composition ratio in step a.

2. A method according to claim 1, wherein the mole ratio of Ga to As in said melt is between about 0.96:1 and about 0.98:1.

3. A method according to claim 1, wherein the mole ratio of Ga to As in said melt is maintained between about 0.96:1 and about 0.98:1.

4. A method according to claim 1, wherein the step c) further comprises the steps of:
    comparing the remaining melt composition of said GaAs compound semiconductor melt to the initial melt composition of step a) to detect any variation of the Ga/As mole ratio between the initial melt composition and the remaining melt composition; and
    adding Ga in an amount sufficient to eliminate any variation detected.

5. A method according to claim 4, wherein said adding is performed when said variation of the Ga/As mole ratio between the initial melt composition and the remaining melt composition reaches a predetermined value of Ga/As mole ratio variation within 0.1.

6. A method according to claim 4, wherein said remaining melt composition $X'$ is determined in accordance with the following equation:

$$X' = \frac{MGa - \frac{ZGa}{ZGa + ZAs} \cdot g_i \cdot M}{Mas - \frac{ZAs}{ZGa + ZAs} \cdot g_i \cdot M} \cdot \frac{ZAs}{ZGa} \quad (1')$$

wherein:

$$MGa = \frac{ZGa \cdot X}{ZAs + ZGa \cdot X} M,$$

$$MAs = \frac{ZAs}{ZAs + ZGa \cdot X} M,$$

X is the initial melt composition in terms of Ga/As mole ratio;
M is the weight of the initial GaAs melt,
MGa is the weight of the Ga in the initial GaAs melt,
MAs is the weight of the As in the initial GaAs melt,
ZGa is the atomic weight of Ga,
ZAs is the atomic weight of As, and
$g_i$ is the solidified ration according to the formula:

$$g_i = W/M$$

wherein W is the weight of the pulling crystal and M has the value given above.

7. A method according to claim 1, wherein the quantity of said melt to be added is equal to the multiplication product of the change in the solidified ratio of said GaAs compound semiconductor melt and the total amount of said Ga melt needed until all of said GaAs compound semiconductor melt is solidified.

8. A method according to claim 7, wherein said solidified ratio is determined by measuring the weight of the crystal being pulled up.

9. A method according to claim 1, wherein Ga is added into said GaAs compound semiconductor melt intermittently at intervals.

10. A method according to claim 9, wherein the intervals between successive intermittent additions of Ga decrease as the solidification of said GaAs compound semiconductor melt proceeds.

11. A method according to claim 1, wherein step c) further comprises the steps of:
adding said element in an amount sufficient to eliminate any variation between the initial melt composition of step a) and the remaining melt composition of said compound semiconductor melt; and
waiting for a period.

12. A method according to claim 1, wherein said capsule layer comprises boron oxide melt.

* * * * *